United States Patent [19]

Hallman et al.

[11] Patent Number: 4,564,589

[45] Date of Patent: Jan. 14, 1986

[54] IMAGE-FORMING COMPOSITE WITH FILM

[75] Inventors: Robert W. Hallman, Poway; Eugene L. Langlais, San Diego; Patrick G. Warner, Escondido, all of Calif.

[73] Assignee: Advanced Imaging Systems Ltd., Poway, Calif.

[21] Appl. No.: 577,536

[22] Filed: Feb. 6, 1984

[51] Int. Cl.[4] .............................................. G03C 1/82
[52] U.S. Cl. .................................. 430/524; 430/271; 430/275; 430/945
[58] Field of Search ............... 430/271, 945, 275, 524, 430/154, 162

[56] References Cited

U.S. PATENT DOCUMENTS

| | | | |
|---|---|---|---|
| 3,625,696 | 12/1971 | Kraveh et al. | 430/271 |
| 3,639,185 | 2/1972 | Colom et al. | 156/13 |
| 4,113,494 | 9/1978 | Hallman | 96/75 |
| 4,218,689 | 8/1980 | Bloom et al. | 430/945 |
| 4,292,392 | 9/1981 | Ikeda et al. | 430/271 |
| 4,300,143 | 11/1981 | Bell et al. | 430/945 |
| 4,329,697 | 5/1982 | Bell | 430/945 |
| 4,355,099 | 10/1982 | Trautweiler | 430/271 |
| 4,394,661 | 7/1983 | Peeters | 430/945 |

FOREIGN PATENT DOCUMENTS

| | | |
|---|---|---|
| 1514420 | 6/1978 | United Kingdom . |
| 1525757 | 9/1978 | United Kingdom . |

OTHER PUBLICATIONS

Article entitled "New Venture for Sage Technology" in Dec. 1981, issue of Technology Watch.

Primary Examiner—Jack P. Brammer
Attorney, Agent, or Firm—James W. McClain; Stanley A. Becker

[57] ABSTRACT

An image-forming composite image member and subtractive photo process employing that composite, in which composite, a spectrally reflective light-blocking layer, a secondary thin optically functional layer and a subtractive photosensitive layer are carried on a base in an association, in which the reflective layer and the secondary layer cooperate after imagewise exposure and development to define an image member in which the secondary layer and reflector layer may provide a guide to orientation of the composite and may provide a unique polarity-reversing ability to display both a negative and a positive image. In a preferred form, the reflective and secondary layers provide superior uniform light-blocking with a minimum combined thickness, and also cooperate in the photo process during the development to insure rapid and complete clearing of areas with at most minimal mechanical action under portions of the photosensitive layer which are soluble after imagewise exposure and have been removed in development.

11 Claims, 2 Drawing Figures

IMAGE-FORMING COMPOSITE WITH FILM

FIELD OF THE INVENTION

This invention relates to non-silver image-forming photo reproduction films and plates and to processes of developing them.

BACKGROUND OF THE INVENTION

Photosensitive films for graphic arts intermediates are preferred to exhibit hard gradation, high maximum density and are usually referred to as "Lith" films. Recent industry trends have demonstrated a desire for both roomlight handling and rapid development.

Silver halide based systems responding to this change have in many respects debased the performance of the inherent high sensitivity lith-developing precursor films. As such, the box to box consistency, exposure latitude, dimensional stability and image acuity have each suffered in the product evolution from darkroom-lith development to roomlight-rapid access development.

The capricious value of silver makes it difficult for both the manufacturer and user to predict future costs. Additionally, silver has been identified as a toxin to the environment and is undergoing increasing restrictions in regards to waste disposal. For each of these reasons, new films suitable for lith-film purposes have been sought. The types of films described in the literature include:

1. Roomlight handleable silver films.
2. Carbon black filled or layered photo polymer films.
3. Diazo-dye coupled films and
4. Photo polymer-metal etch films.

Type 1 offers the advantage of product continuity and familiarity; however, the dot for dot copying capability limitations together with varying sensitivity, limited exposure latitude and of course the inherent silver cost leave substantial gaps in the performance needs.

Type 2 films such as described in European Pat. No. 0,048,160 A 1 and U.S. Pat. No. 4,229,517 are of unknown quality. However, due to the mechanical type development, they are suspected to be of limited resolution and image acuity. Additionally the use of special, dedicated processors may restrict acceptance levels.

Type 3 films lack the important black opaque characteristics as well as dot etchability and a reliable negative working analog. The requirement for special processors and the use of ammonia development further limits acceptability to the printer.

Type 4 films are generally of high quality and are etchable, but often suffer from a high degree of pinholes inherent in thin metallic layers. Their acceptability has been further burdened by the unfamiliar reflective appearance and the requirement for special processors.

BRIEF SUMMARY OF THE INVENTION

It is an object of this invention to provide a unique image-forming composite structure and process which results in a high quality non-silver film with the performance features of interest: high image quality, familiar appearance, and existing rapid access processor development without the limitations inherent in the predecessor films.

These and other advantages are secured in the image-forming composite and development process of the present invention through the association on a support base of a spectrally reflective light blocking layer, a secondary optically functional layer and an overlying subtractive photosensitive layer. In the development process, after dissolving portions of the photosensitive layer which are soluble after imagewise exposure, solution of the reflective layer along with the secondary layer provides superior clearing action. The reflective layer and secondary layer provide in the developed composite a unique optical character and a guide to orientation.

DETAILED DESCRIPTION OF THE PREFERRED EMBODIMENT

Figure 1:
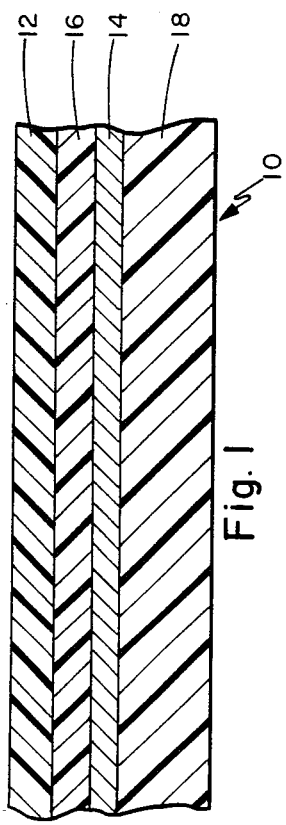
FIG. 1 is a sectional view of a photoreproduction composite according to the present invention.

The association in the composite 10 of the present invention of a subtractive photosensitive layer 12 over a special image-forming combination of a spectrally reflective, i.e. mirror-like, light-blocking layer 14 and a secondary light-blocking or other optically functional layer 16 carried by a support 18 as shown in FIG. 1, provides a cooperative action between the layers which enables each layer to be used to greatest advantage. The reflective layer 14 is very effective in blocking light even in extremely thin layers; and a secondary light-blocking layer 16 minimizes leakage of light through any pinholes which may be present in the reflective layer 14, which, in extremely thin layers, may be more prone to have pinholes due to dust or irregularities on a transparent support 18. Additionally, the reflective layer 14 is on the face of the composite 10 from which light is supplied in optical use of the composite where it is effective in reducing heat buildup in use of the composite for long or multiple use burns or in use as a projection transparency. A secondary light blocking layer 16, on the other hand, provides a surface which is not spectrally reflective, i.e. which diffuses, colors or absorbs light to minimize loss of definition in certain uses. As a bonus, the reflective surface 14 is clearly distinguishable from a dyed or pigmented secondary layer 16 and thus provides a sure identification of the viewing direction in which the composite 10 is to be disposed in the making of prints or other optical use.

The photosensitive layer 12 on the surface of the composite 10 may be any of the known subtractive systems, either positive or negative working. That is, photosensitive compositions of which after image wise exposure, the portions receiving light are soluble or insoluble in a developer and portions not receiving light are insoluble or soluble respectively so that the developer will remove soluble portions of the photosensitive layer and dissolve the pigmented or dyed layer and the reflective layer underlying the soluble portion to form an image.

An important advantage of the relation of the reflective layer 14 and a pigmented or dyed light blocking layer 16 in the present image-forming composite 10 is the complete clearing during development of areas around image areas with the need for at most minimal mechanical action. It is believed that this is due in considerable measure to the developer action in dissolving and washing away most of the pigmented or dyed layer 16 and dissolving the reflective layer 14 which lies beneath it to carry away any residual pigment or dye in the non-image areas. This action is particularly effective because of the thinness of the pigmented or dyed layer 16, usable because of the opacity of the reflective layer so that there is less pigment or dye to dispose of.

The support 18 on which the secondary light-blocking and photosensitive layers 14 and 16 are carried may be of any dimensionally stable rigid or flexible material not attacked by the developer solution and suitable for the intended end use of the composite 10. For the preferred use of the composite in optical masks, lithographic film, projection transparencies, light stencils and the like, the support 18 would be transparent; but for other uses, such as proofing papers and velox paste-ups the support may be translucent or even opaque. Materials such as polyethylene terephthalate, polycarbonate, polystyrene, methyl methacrylate, glass, paper, polyethylene, polypropylene, cellulose acetate or cellulose butyrate may be used. The support may also be provided with a subbing layer (not shown) to improve adhesion of the other layers.

The spectrally reflective light blocking layer 14 is formed on the support by conventional techniques, such as vapor or sputter deposition of materials. Useful materials, capable of solution and removal by appropriate liquid developers include aluminum, copper, zinc, tin, chromium, iron, tellurium, nickel, selenium, germanium, bismuth, indium or mixtures or alloys of these materials. Mixtures or compounds of these elements with oxygen and with sulfur may be included in the spectrally reflective layer to reduce its reflectivity by a desired amount. Extremely thin substantially continuous layers of these materials have excellent optical densities so that layers from only 50 A° to 10,000 A° have optical densities for ultraviolet light of from about 0.01 to about 5.00 and are rapidly attacked and removed by developers.

A secondary light blocking layer 16 carried on the spectrally reflective layer may employ dyes and/or pigments held in a binder to absorb or reflect actinic light. Since this layer 16 works in tandem with the spectrally reflective layer 14, it too may be very thin, preferably only 0.01 up to about 10 microns and may have an optical density for ultraviolet light of from about 0.01 to about 4.0 so that the combined thickness of the spectrally reflective layer 14 and the secondary layer 16 is such as to secure good resolution in optical use.

Alternative secondary layers include dark mirror anti-reflective coatings in which case it may be advantageous to reverse the order so that the anti-reflective coatings are between the spectrally reflective layer 14 and the substrate support. In this structure the anti-reflective coatings need not be soluble in the developer and after the dissolution of the spectrally reflective layer will appear clear. Dark mirror coatings include refractory material such as magnesium or calcium fluorides or oxides whose indices of refraction can be controlled by multiple layering technique to cause destructive interference of reflected light so that the surface of the coatings appears to be black. However, when the spectrally reflective layer is dissolved, the residual material such as the calcium or magnesium fluoride appears clear to transmitted light.

Yet another secondary layer includes metal sulfides or oxides which provide a dark, near black appearance, yet are soluble in a suitable developer.

The thickness and opacity of the secondary layer with the above limits will be chosen to provide that the combined optical density of the spectrally reflective layer and the secondary light-blocking layer for ultraviolet light will be at least 2.0, and preferably from about 3.1 to 4.5 or higher.

Binders useful in the secondary light-blocking layer may be selected from a variety of materials which are stable in normal handling to keep the pigment and/or dye in place and which are readily dissolved by suitable liquid developers. Resins and mixtures of resins which are at least partially soluble in alkaline developing solutions which are also capable of dissolving the reflective light-blocking layer are especially useful. Such resins and mixtures of resins can be exemplified by, but not limited to, the following: collophony, shellac, phenol formaldehyde resins, carboxylated polyvinyl acetate, polyacrylamide-polyacrylic acid copolymers, polyvinyl acetate-itaconic acid copolymers, phenol formaldehyde novalak resins, m-cresol formaldehyde novalak resins, ethyl acrylate or methyl methacrylate copolyers with acrylic or methacrylic acid, vinyl acetal-vinyl phthalate copolymers, styrene maleic anhydride copolyers, linear ethylene maleic anhydride resins, poly(methyl-vinyl ether) meleic anhydride resins, poly(methyl-vinyl ether) maleic acid half-ester resins; polyester resins containing alkyds, amides, or urea-aldehyde with acid numbers over 50; olefinic copolymers with unsaturated dicarboxy compounds such as maleic, fumaric, citraconic and itaconic acids and half-esters; and others known to those sufficiently skilled in the art.

Resins substantially soluble in water such as, but not limited to, polyvinyl alcohol, methylcellulose, hydroxyethyl cellulose, hydroxy-propryl cellulose, sodium alginate propylene glycol alginate, hydrolyzed starch, dextrin, gum arabic, carageenan, gum tragacanth and similar materials can be used to advantage in modifying the solubility properties of the binder resins.

Similarly, resins which are substantially insoluble in water or the alkaline developing agents may also be used to impart modified solubility characteristics as well as modified physical characteristics such as flexibility, scratch resistance, abrasion resistance, crack resistance, and other like-enhancing properties. Such resins as, but not limited to, polyvinyl formal, polyvinyl butyral, polyesters, polycarbonate polyvinyl acetate, polyvinyl sulfone, phenoxy resins, vinyl resins, epoxy resins, cellulose acetate cellulose acetate butyrate, and others can be used to advantage.

Other materials will readily suggest themselves to those skilled in the art. The usable concentrations of such insoluble resins can be higher than normal due to the total solubility of the underlying reflective light blocking layer which during the process of development enables such portion of insoluble materials to be washed away.

These binder resins, preferably in the form of latices or solutions in volatile solvents, may be used for forming the secondary layer. The dyes and/or pigments are dissolved and/or dispersed in the binder material by conventional means. Suitable dyes and pigments include: carbon black, monastral fast blue (CI no. 74160), Zapon fast blue HFL (CI no. 74360), Vat black HB (CI no. 36150), copper oxide, manganese oxide, iron oxide, phthalo-cyanine blue, molybdate orange, quinaccridone violet 19, Aurespere W7012 (from Harshaw), Bismark brown R, Victoria blue B, methyl violet, acid green 3, Nigrosine BRC, Nigrosine SSBB, Morfast black (Morton Chemicals), direct brown 113, direct black 19, pyrrazol black N (Sandoz Chemicals), Resorcine brown B, Sandolan black E-14L (Sandoz), acid black 1, acid brown 126, Flexo black X80 (BASF), Neazapon black X50 (BASF) Hekto blue (BASF), Sudan blue 670 (BASF), Solvent blue 58 (Morton), solvent blue 97, special brilliant blue FFR (Morton) and many others.

It will also be obvious that mixtures of various dyes, various pigments, or various dyes and pigments will yield articles of benefit to this invention.

The dye or pigment is readily incorporated and held in the binder. Since the secondary light blocking layer is disposed in tandem with the spectrally reflective layer and operates to cover any pinholes in the spectrally reflective layer, there is no need for unusually high pigment or dye loadings in order to achieve high optical densities, so degredation of the physical and chemical properties of the secondary light blocking layer is avoided. The dye or pigment concentration is ordinarily from about 5% to about 30% of the layer based on the weight of the binder solids.

The photosensitive layer may be any suitable subtractive positive or negative working photoactive composition of which, after imagewise exposure to actinic radiation, portions exposed to such radiation have different solubility in a selected solvent from portions which were not so exposed.

PHOTOSENSITIVE MATERIALS/NEGATIVE WORKING

Suitable materials include diazo compounds such as condensation products of paradiazo diphenylamine sulfate or its derivatives with paraformaldehyde or other materials containing reactive carbonyl groups, such as ketones, aldehydes, and acetals. The preparation of such compounds is disclosed in U.S. Pat. Nos. 2,922,715 and 2,946,683. Diazo compounds which have not been condensed are also useful in certain formulations. These diazonium salts, such as substituted diazo-benzenes, substituted diazo-p-amino benzenes, diazo-p-amino esters, and diazo-mercapto-benzenes used by the diazotype industry and reviewed in "Light Sensitive Systems" by T. Kosar (Wiley, 1965) and "Photosensitive Diazo Compounds" by M. Dinaburg (Focal Press, 1964) are well known. These salts as zinc chlorides double salts or stabilized precipitates with fluoroboric acid or hexafluorophosphoric acid are commonly used.

Furthermore, the diazonium salts or condensation products normally water soluble are often reacted with materials to render them water insoluble for inclusion in non-aqueous coating systems. Such materials are usually derived from organic carboxylic acids such as decanoic acid and benzoic acid; organic phosphonic acids, such as phenylphosphonic acid; and sulfonic acids such as aliphatic and aromatic sulfonic acids typified by methane sulfonic acid, dodecane sulfonic acid, benzene sulfonic acid, toluene sulfonic acid, mesitylene sulfonic acid, anthraquinone sulfonic acid, hydroquinone sulfonic acid; 2 hydroxy-4 methoxy-benzophenone-5-sulfonic acid; 4-acetylbenzene sulfonic acid; dimethyl-5-sulfoisophthalate, 5,5-bis(4' hydroxyphehyl)-pentanesulfonic acid; naphalene-2-sulfonic acid; 1-napthol-7 sulfonic acid; 2,4-dinitro-1-napthol-7-sulfonic acid, o-toluidene-m-sulfonic acid; m-(p'-analino-phenylazo)-benzene sulfonic acid and the like. Inorganic complex anion bearing materials may also be used such a phosphotungstic acid, phosphomolybic acid, potassium ferrocyanide, silico tungstic acid and similar materials.

Other negative acting diazo, azo and azido materials may also be used, such as 4,4'-diazido-stilbene-2,2'-disulfonic acid; di-(4-azido-2'-hydroxy-benzal)-acetone-2-sulfonic acid; 2-benzoin-methylene-1-methyl-beta-napthothiazoline; diazo sulfonates; diazo biguanides; 2(4'-azidophenyl)-5-methyl-benzimidazole, 4,4'-diazidochalcone; 2,6-di-(4'-azidobenzal)-cycohexanone, benzoquinone-(1,4)-diazide-4. Certain chalcone condensates with styrenemaleic anhydride are also useful such as 4'(beta-hydroxymethoxy-ehoxy)chalcone. Also certain stilbene compounds such as 4-nitro-4'-methoxy-2-sulfanilidostilbene or 4,4'-dinitro, 2,2'-bis(sulfo-m-chloro-anilido)-stilbene are found to be useful.

Although the aforementioned compounds are extremely useful, other photopolymers which are developable in alkaline systems such as those based upon unsaturated compounds and polyamides sensitized with benzoin ethers or benzophenone derivatives are not to be excluded. One such example would be a mixture of polyvinyl acetate with triethylene glycol diacrylate, benzoin methyl ether, anthraquinone and a suitable solvent such as methoxy ethanol.

PHOTOSENSITIVE MATERIALS/POSITIVE WORKING

Most useful ingredients for positive-working photosensitive layers are the o-quinone diazides and their esters and amides derived from 2,1,5 or 2,1,4 napthoquinone-diazide sulfonyl chloride. Such products are adequately reviewed in "Light Sensitive Systems" by T. Kosar and "Photosensitive Diazo Compounds" by M. Dinaburg and can be found in U.S. Pat. Nos. as 3,046,118 and 3,046,1234 and 3,106,645.

Typically, the positive working photosensitive precursor diazo compound such as napthoquinone-(1,2)-diazide-(2)-4-sulfonyl chloride or naphthoquinone-(1,2)-diazide-(2)-5 sulfonyl chloride is condensed, in an alkaline medium such as a solution of $Na_2CO_3$, $NaHCO_3$, $Na_3PO_4$ or the like, with such materials as follow. Such typical condensation materials are 2,5-dihydroxy-benzophenone; 2,5-dihydroxy-benzaldehyde; 2,4-dihydroxy-benzoic-acid-methyl-ester; 2,3,4,-trihydroxy-phenylanthaquinoyl-(2)-ketone; 2,3,4,2'-tetrahydroxybenzophenone and the like.

Structurally, which can be even more instructive and elucidating, these resulting compounds and other useful examples can be illustrated by, but not limited to the following:

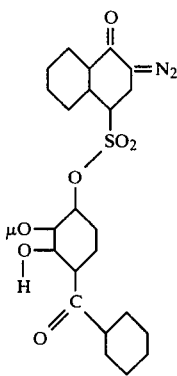

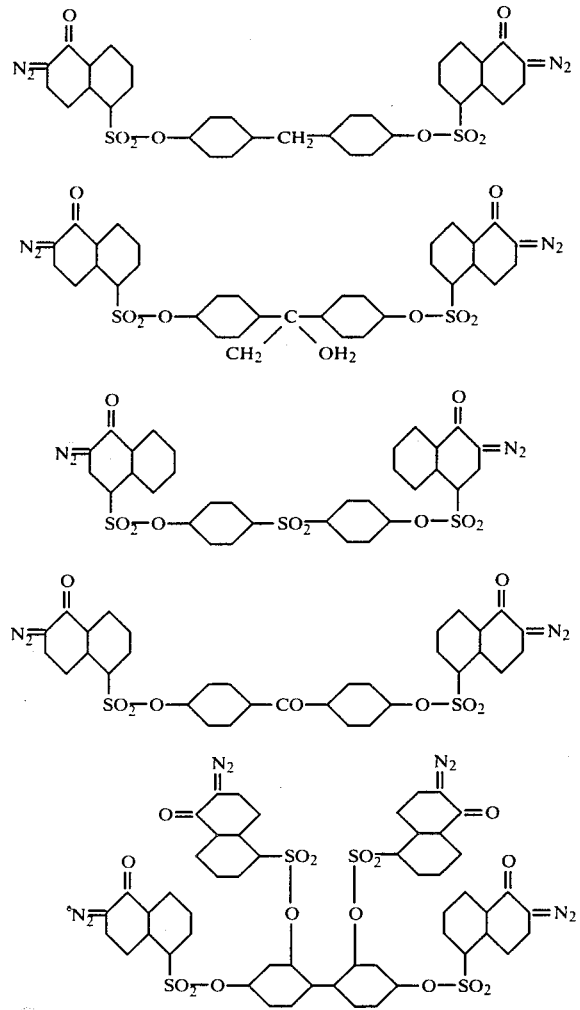

-continued

To form an image on the composite, it is exposed to actinic radiation such as ultraviolet light in association with an image forming master which provides exposed and unexposed areas on the composite. Any ultraviolet light source providing radiation in the range to which the photosensitive compound is responsive, typically 350 to 400 nm, may be used, such as fluorescent bulbs, xenon or mercury vapor lamps, laser sources or sunlight. Exposure is continued for a time dependent on the photosensitivity of the deposit and the intensity of the radiation to change the solubility characteristics of the photosensitive layer. This may be conversion of the exposed areas to insoluble state leaving the unexposed areas soluble, or conversion of the exposed areas to a state soluble in a selected solvent in which the unexposed areas are insoluble.

Development of the image on the exposed composite is effected through contact of the composite with a developer and with at most minimal mechanical action to effect complete removal of the soluble portions of the photosensitive layer and of the secondary and spectrally reflective layers beneath the soluble portion. This is particularly valuable property since it enables development in the simple, commercially available development apparatus.

Figure 2:
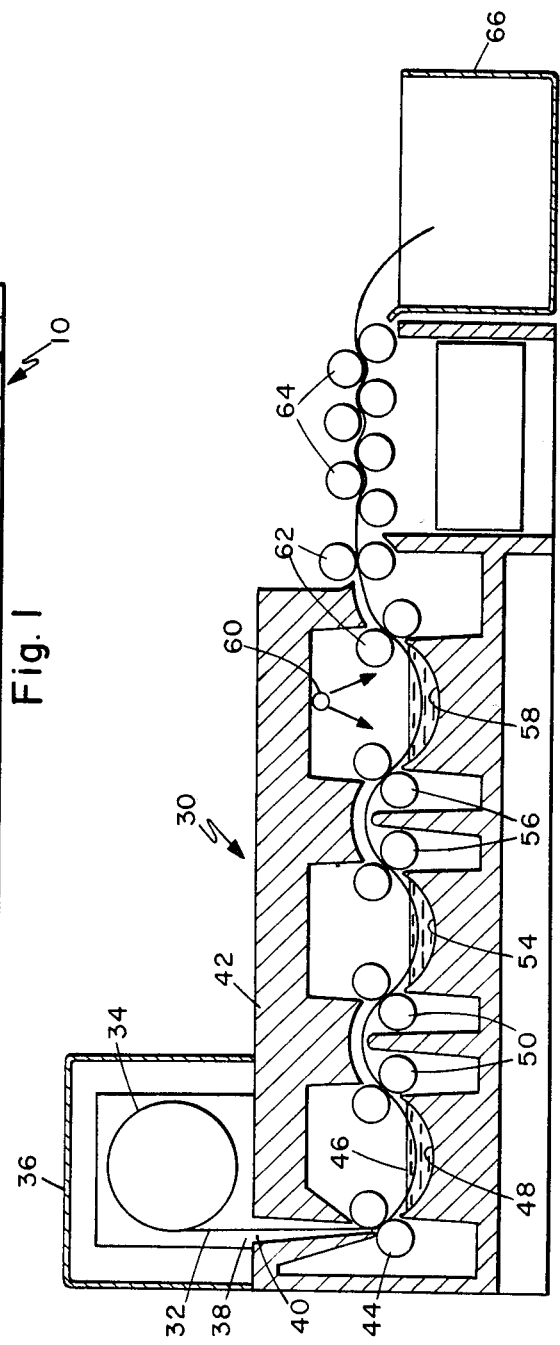
FIG. 2 is a diagrammatic sectional elevational view of a machine which may be used for developing and drying the exposed composite.

The device 30 illustrated in FIG. 2 is an existing machine commercially available for developing silver based photocopying materials in which imagewise exposed photocopying material 32 from a roll 34 in the light proof box 36 is fed through an opening 38 in the box 36 to an opening 40 in the housing 42 around the processing portion of the machine. From the opening 38, the material passes through feed rollers 44 down into processing liquid 46 in a first trough 48, through feed rollers 50 into a trough 54 and through feed rollers 56 to a trough 58 in which it is washed and subjected to a wash spray from the sprinkler 60 and finally through feed rolls 62 to a series of drying rolls 64 from which it is discharged into a receptacle 66.

In use of the machine with the present photocopying material, both the first and second mentioned troughs 48 and 54 are filled with developer solution for the present material since the fixer solution used in treating silver based material is not required.

After washing and drying, the resulting image-bearing composite is ready for use and has been found to provide a high contrast image and excellent accuracy of reproduction of the master image, particularly in fine detail.

A further useful novel aspect of the developed composite is its unique ability to display both a negative and a positive image; that is, when viewed from the side carrying the photosensitive layer, the image is a negative, in which areas that are to be light in a finished photo-reproduction are dark, and areas that are to be dark in the photo-reproduction are light. But, when viewed through the transparent support against a dark background, a positive image is displayed in which light and dark areas are the same as in a finished photo-reproduction, so that the character of the finished reproduction can be readily evaluated. As noted earlier, this difference in aspect also provides a useful means of orientation of the composite.

Developers for acting on the composite after imagewise exposure are liquids which act on the photosensitive layer to dissolve soluble portions of that layer and to dissolve portions of the secondary light-blocking layer and the spectrally reflective layer beneath the soluble portion. While separate developers may be used to dissolve separate layers, by proper selection of the materials of the layers to coordinate their solubility characteristics, it is possible to dissolve all these layers with a single developer solution.

In general, developers are aqueous alkaline solutions having a pH of from about pH 10.0 to about pH 13.5 containing from about 0.5% to about 15% by weight of nonionic, anionic or amphoteric surfactants or a mixture of nonionic and anionic surfactants. Useful alkaline materials include sodium, lithium or potassium hydroxides and carbonates, trisodium phosphate, sodium silicate and mixtures of these. It has also been found that the clearing action is improved in some cases by inclusion of a mild oxidizing agent such as a sodium, lithium or potassium hypohalite hallate or perborate.

The following examples are given to aid in understanding the invention; but it is to be understood that the invention is not limited to the particular materials or procedures employed in the examples.

EXAMPLE 1

A transparent 4 mil thickness support sheet of polyethylene terephthalate resin is coated by vapor deposition with a spectrally reflective layer of aluminum 1000 angstroms thick and having an optical density of about 4.0. A secondary light blocking layer having a thickness of 1.5 microns and an optical density of about 1.5 is laid down on the surface of the aluminum layer from a suspension of 10% by weight carbon black in a 40% by weight solution of a styrene-maleic anhydride resin in dimethyl formamide. The exposed face of the secondary layer is then coated with a 1.1 micron thick positive working, subtractive photosensitive layer from a solution containing 10 grams of the reaction product of 2-diazo-1-naphthol-5 sulfonyl chloride with p-tertiary butyl phenol formaldehyde obtained from Molecular Rearrangement Inc. as "Diazo PPR 12," 3 grams of a carboxy functional acrylic polymer obtained from Cyanamide as "XC4011" and 2 grams of "Alkyd Polyester 19788," manufactured by Hooker Chemical Co. in 15 grams of dimethyl acetamide.

The composite is then placed in contact with a 150 line bichrome tint guide in a vacuum frame and exposed at room temperature to a 4 KW mercury vapor ultraviolet light source at a distance of 24 inches for 40 seconds.

The exposed composite is removed from the frame and developed by immersion for 60 seconds in a solution of 10 grams of sodium hydroxide, 25 grams of sodium carbonate, 1000 grams of sodium hypochlorite, 100 grams of trisodium phosphate and 50 grams of an anionic surfactant in 2,700 grams of water at room temperature.

After removal of the composite from the developer solution, washing in water at room temperature and drying, it is found that the photosensitive layer, the secondary layer and the aluminum layer are dissolved cleanly away in areas exposed to light through the tint guide leaving such areas clear and with a sharp, positive reproduction of the lines of the tint guide.

EXAMPLE 2

A transparent, 4 mil thickness polyethylene terephthalate support sheet is coated by vapor deposition with a spectrally reflective layer of tellurium 1000 angstroms thick, havng an optical density of about 4.0. A secondary light blocking layer like that of Example 1 is laid down on the surface of the tellurium layer and the exposed face of the secondary layer is then coated with a 1.5 micron thick photosensitive layer from a solution containing 15 grams of "LL Diazo" from Molecular Rearrangement Inc. understood which is to be 2-diazo-1-naphthol-5 sulfonyl chloride reacted with phenol formaldehyde, 10 grams of "Novolak 1280" from Union Carbide dissolved in 80 grams methyl cellosolve.

The resulting composite is exposed to a negative halftone master using the conditions employed in Example 1 and developed by immersion for 30 seconds at room temperature in a developer comprising a solution of 22 grams of sodium carbonate, 30 grams of lithium hypochlorite and 1 gram of an anionic surfactant in 900 grams of water.

After removal of the composite from the developer solution, washing and drying, it is found that the photosensitive layer, the secondary layer and the tellurium layer are dissolved cleanly away in areas exposed to light through the tint guide leaving such areas clear and that the lines of the tint guide are sharply reproduced.

When viewed from the side of the composite away from the support sheet, the image shown is a duplicate of the image of the negative halftone master. When a darkly colored sheet is placed on the surface opposite the support sheet and the sheet viewed from the side of the support sheet, the appearance is as of a positive, that is a reversal of the image previously referred to.

EXAMPLE 3

A transparent support sheet is coated with tellurium as in Example 2 and a secondary light blocking layer like that of Example 1 is laid down. The exposed face of the secondary layer is then coated with a 1.5 micron thick negative acting photosensitive layer from a solution containing 20 grams of p-diazo diphenylamine condensed with paraformaldehyde ("BBP" obtained from Molecular Rearrangement), 20 grams of acid-functional styrene/acrylic resin ("Joncryl 678" obtained from Johnson Wax Company) dissolved in 40 grams of dimethyl acetamide.

The composite is then placed in contact with a photographic halftone negative in a vacuum frame and exposed at room temperature to ultraviolet light as in Example 1.

The exposed composite was developed as in Example 2, washed and dried.

The resulting sheet showed complete clearing of areas shielded from light during exposure and the resulting image is a positive reversal of the original halftone negative.

EXAMPLE 4

A transparent support sheet is coated with aluminum as in Example 1 and a "dark mirror" coating of materials whose indices of refraction and multilayer arrangement cause destructive interference of reflected light is applied. A positive photosensitive coating is applied and the composite exposed and developed as in Example 1. After washing and drying it is found that the photosensitive layer, the secondary layer and the aluminum layer are dissolved cleanly away in areas exposed to light leaving such areas clear and with a sharp reproduction of the tint guide.

EXAMPLE 5

A transparent, 4 mil thickness polyethylene terephthalate support sheet is coated with a dark mirror coating applied and thereafter a spectrally reflective coating of aluminum 1000 angstroms thick coating is laid down. A positive photosensitive coating is laid down and the composite is exposed, developed, washed and dried as in Example 1.

The photosensitive layer and the aluminum layer are dissolved cleanly away in areas exposed to light leaving such areas clear and with a sharp reproduction of the lines of the tint guide. The dark mirror coating is not dissolved. On viewing, with a light behind the composite the areas from which the aluminum is dissolved show bright and the areas where the aluminum remains appear dark. When the composite is viewed from the supporting sheet side with a dark paper held behind the composite, the areas in which the aluminum remains appear bright and the areas from which the aluminum is no longer present appear dark so that the image seen is a reversal of the image seen from the other side.

EXAMPLE 6

A composite comprising support sheet, aluminum layer, secondary layer and photosensitive layer is prepared and exposed as in Example 1:

The exposed composite is fed through the opening in the light proof box of the commercial developing machine shown in FIG. 2 in which the first and second troughs contain the developer of Example 1. The composite is passed through the feed rollers into and through the developer in the first and second troughs and then through feed rollers to the third trough in which it is washed and subjected to a wash spray from the sprinkler. After passing through the final feed rolls and around the drying rolls it is discharged into the receptacle. In the machine, the composite is exposed to the developer for 30 seconds in each trough and it is found that the photosensitive layer, the secondary layer and the aluminum layer are dissolved cleanly away in areas exposed to light through the tint guide, leaving such areas clear and with a sharp reproduction of the lines of the tint guide.

We claim:

1. A photo reproduction composite graphic arts intermediate lith film comprising a support base carrying:
   a. a spectrally reflective layer and a light-blocking non-reflective dyed or pigmented secondary layer, said layers having a combined optical density of at least 2.0; and
   b. an overlying non-silver subtractive positive or negative working photosensitive layer;
   the conjunction of said reflective layer and said secondary layer preventing significant pinhole light leakage through said composite and providing adequate optical density with reduced combined layer thickness.

2. A photo reproduction composite as defined in claim 1 in which said reflective layer, said secondary layer and said photosensitive layer are arranged in that order on said base, and during development of the composite after exposure removal of said reflective layer enhances removal of said secondary layer to insure rapid and complete clearing of areas under portions of said photosensitive layer which are soluble in a developer after imagewise exposure of said composite.

3. A photo reproduction composite as defined in claim 2 in which said reflective layer and said secondary layer are both soluble in the developer for said photosensitive layer.

4. A photoreproduction composite as defined in claim 3 in which said spectrally reflective layer is an alloy, metal, metal sulfide or oxide, or mixtures thereof, and said secondary layer comprises a binder, a pigment, and/or a dye.

5. A photo reproduction composite as defined in claim 4 in which said base is light transmissive or transparent.

6. A photo reproduction composite as defined in claim 1 in which said combined optical density is at least about 3.1.

7. A photo reproduction composite as defined in claim 6 in which the optical density of said secondary layer is from about 0.1 to about 4.0 and the optical density of said reflective layer is from about 0.1 to about 5.0.

8. A photo reproduction composite as defined in claim 7 in which said reflective layer is from about 50 A to about 10,000 A in thickness and is formed from a material selected from the group consisting of aluminum, tellurium, copper, zinc, tin, chromium, iron, nickel, selenium, bismuth, germanium, indium, and mixtures and alloys of these.

9. A photo reproduction composite as defined in claim 1 in which said base is transparent and said secondary layer is a dark mirror coating of materials whose indices of refraction and multi-layer arrangement cause destructive interference of reflected light.

10. A photo reproduction composite as defined in claim 9 in which said reflective layer and said secondary layer are arranged in that order on said base.

11. A photo reproduction composite as defined in claim 9 in which said secondary layer is adjacent said base and said reflective layer overlies said secondary layer.

* * * * *